(12) United States Patent
Ramkumar

(10) Patent No.: US 9,824,895 B1
(45) Date of Patent: Nov. 21, 2017

(54) METHOD OF INTEGRATION OF ONO STACK FORMATION INTO THICK GATE OXIDE CMOS FLOW

(71) Applicant: Cypress Semiconductor Corporation, San Jose, CA (US)

(72) Inventor: Krishnaswamy Ramkumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/370,149

(22) Filed: Dec. 6, 2016

Related U.S. Application Data

(60) Provisional application No. 62/400,493, filed on Sep. 27, 2016.

(51) Int. Cl.
| | |
|---|---|
| *H01L 21/8234* | (2006.01) |
| *H01L 21/28* | (2006.01) |
| *H01L 27/115* | (2017.01) |
| *H01L 27/092* | (2006.01) |
| *H01L 29/423* | (2006.01) |
| *H01L 29/66* | (2006.01) |
| *H01L 27/105* | (2006.01) |
| *H01L 21/8238* | (2006.01) |
| *H01L 21/02* | (2006.01) |
| *H01L 27/11568* | (2017.01) |
| *H01L 21/762* | (2006.01) |

(52) U.S. Cl.
CPC .. *H01L 21/28282* (2013.01); *H01L 21/76202* (2013.01); *H01L 27/11568* (2013.01)

(58) Field of Classification Search
CPC ........... H01L 27/1052; H01L 27/11568; H01L 27/105; H01L 27/11573; H01L 27/11521

USPC ................................. 438/275, 216, 287
See application file for complete search history.

(56) References Cited

U.S. PATENT DOCUMENTS

| | | | |
|---|---|---|---|
| 6,265,268 B1 | 7/2001 | Halliyal et al. | |
| 6,689,653 B1 | 2/2004 | Seah et al. | |
| 6,946,349 B1 | 9/2005 | Lee et al. | |
| 7,390,718 B2 | 6/2008 | Roizin et al. | |
| 8,189,397 B2 | 5/2012 | Eitan et al. | |
| 8,409,950 B1 | 4/2013 | Shea et al. | |
| 8,993,457 B1 * | 3/2015 | Ramkumar | H01L 21/0223 438/763 |

(Continued)

FOREIGN PATENT DOCUMENTS

| | | |
|---|---|---|
| CN | 104576522 A | 4/2015 |
| CN | 103632942 B | 2/2016 |
| WO | 2015112245 A1 | 7/2015 |

OTHER PUBLICATIONS

Hashim, et al., "Fabrication and characterization of ONO and tunnel oxide for 16k FLOTOX EEPROM cell", Semiconductor Physics, Quantum Electronics & Optoelectronics, 2004, vol. 7 No. 1 pp. 112-117.

(Continued)

*Primary Examiner* — Evan Pert
*Assistant Examiner* — Changhyun Yi

(57) ABSTRACT

A method of integrating a silicon-oxide-nitride-oxide-silicon (SONOS) transistor into a complementary metal-oxide-silicon (CMOS) baseline process. The method includes the steps of forming the gate oxide layer of at least one metal-oxide-silicon (MOS) transistor prior to forming a non-volatile (NV) gate stack of the SONOS transistor.

20 Claims, 11 Drawing Sheets

(56) References Cited

U.S. PATENT DOCUMENTS

| | | | |
|---|---|---|---|
| 9,102,522 | B2 | 8/2015 | Ramkumar et al. |
| 9,218,978 | B1 | 12/2015 | Ramkumar |
| 2006/0105522 | A1* | 5/2006 | Steimle .................. B82Y 10/00 438/257 |
| 2010/0264495 | A1* | 10/2010 | Mo .................... H01L 21/28097 257/369 |
| 2015/0006098 | A1 | 3/2015 | Lusetsky et al. |
| 2015/0060983 | A1* | 3/2015 | Lusetsky ........... H01L 29/66825 257/316 |
| 2015/0206942 | A1* | 7/2015 | Glass ................ H01L 29/66795 257/335 |
| 2015/0349126 | A1* | 12/2015 | Tanzawa ............. H01L 29/0657 257/401 |
| 2016/0204120 | A1 | 7/2016 | Prabhakar et al. |

OTHER PUBLICATIONS

Jeong-Mo Hwang, "Bringing Non-Volatile Memory Blocks to Socs Using the Sonos Process", Simtek Corporation; 11 pages.
Krishnaswamy Ramkumar et al., "Cypress SONOS Technology," Cypress White Paper, dated Aug. 2016; 12 pages.
International Search Report for International Application No. PCT/US17/38136 dated Jul. 18, 2017; 5 pages.
Written Opinion of the International Searching Authority for International Application No. PCT/US17/38136 dated Jul. 18, 2017; 8 pages.

* cited by examiner

First Alternative

Second Alternative

METHOD OF INTEGRATION OF ONO STACK FORMATION INTO THICK GATE OXIDE CMOS FLOW

PRIORITY

The present application claims the priority and benefit under 35 U.S.C. §119(e) of U.S. Provisional Application No. 62/400,493, filed on Sep. 27, 2016, which is incorporated by reference herein in its entirety.

TECHNICAL FIELD

The present disclosure relates generally to semiconductor devices, and more particularly to memory cells and methods of manufacturing thereof including an embedded or integrally formed charge-trapping gate stack into an existing complementary metal-oxide-semiconductor (CMOS) foundry logic technology.

BACKGROUND

For many applications, such as system-on-chip, it may be desirable to integrate logic devices and interface circuits based upon metal-oxide-semiconductor field-effect transistors (MOSFET) and non-volatile memory (NVM) transistors on a single chip or wafer. This integration, in some embodiments, may seriously impact both the MOS transistor and NVM transistor fabrication processes. MOS transistors are typically fabricated using a standard or baseline complementary-metal-oxide-semiconductor (CMOS) process flows, involving the formation and patterning of conducting, semiconducting and dielectric materials. The composition of these materials, as well as the composition and concentration of processing reagents, and temperature used in such a CMOS process flow are stringently controlled for each operation to ensure the resultant MOS transistors will function properly.

Non-volatile memory devices include non-volatile memory transistors, such as silicon-oxide-nitride-oxide-silicon (SONOS) based transistors, including charge-trapping gate stacks in which a stored or trapped charge changes a threshold voltage of the NVM transistor to store information as a logic "1" or "0". Charge-trapping gate stack formation may involve the formation of a nitride or oxynitride charge-trapping layer(s) disposed between two dielectric or oxide layers. Charge-trapping gate stack is typically fabricated using materials and processes that differ significantly from those of the baseline CMOS process flow, and which may detrimentally impact or be impacted by the fabrication of the MOS transistors. In particular, forming a gate oxide or dielectric of a MOS transistor may significantly degrade performance of a previously formed charge-trapping gate stack by altering a thickness or composition of the charge-trapping layer(s). In addition, this integration may also impact the baseline CMOS process flow, and generally require a substantial number of mask sets and process steps, which add to the expense of fabricating the devices and may reduce yield of working devices.

Besides, it may be important for the integrated fabrication process to be able to control the thickness of top or blocking dielectric of NVM transistors, for example, in order to meet requirements such as desirable threshold voltages Vts and/or equivalent oxide thickness (EOT) while satisfying gate oxide thickness targets of MOS transistors, especially if those MOS transistors are high voltage input/output (HV I/O) or HV transistors.

BRIEF DESCRIPTION OF THE DRAWINGS

The present disclosure is illustrated by way of example, and not by way of limitation, in the FIGS. of the accompanying drawings.

DETAILED DESCRIPTION

Figure 1:
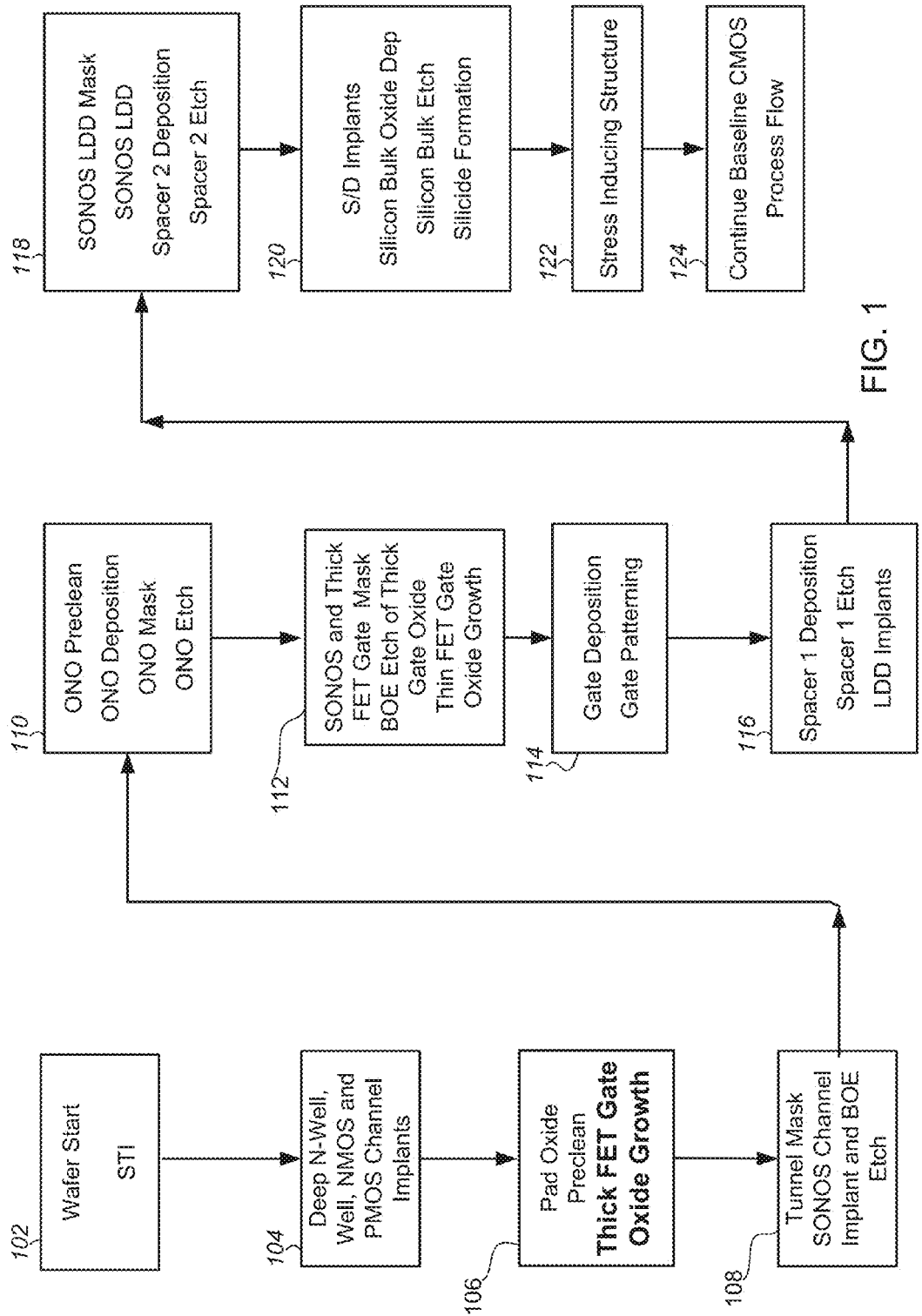
FIG. 1 is a flowchart illustrating an embodiment of a method for fabricating a memory cell including an embedded SONOS based NVM transistor and MOS transistors.

The following description sets forth numerous specific details such as examples of specific systems, components, methods, and so forth, in order to provide a good understanding of several embodiments of the subject matter. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the subject matter.

Embodiments of a memory cell including an embedded non-volatile memory (NVM) transistor and a metal-oxide-semiconductor (MOS) transistor and methods of fabricating the same are described herein with reference to figures. However, particular embodiments may be practiced without one or more of these specific details, or in combination with other known methods, materials, and apparatuses in related art. In the following description, numerous specific details are set forth, such as specific materials, dimensions, concentrations, and processes parameters etc. to provide a thorough understanding of the subject matter. In other instances, well-known semiconductor design and fabrication techniques have not been described in particular detail to avoid unnecessarily obscuring the subject matter. Reference in the description to "an embodiment", "one embodiment", "an example embodiment", "some embodiments", and "various embodiments" means that a particular feature, structure, or characteristic described in connection with the embodiment(s) is included in at least one embodiment of the subject matter. Further, the appearances of the phrases "an embodiment", "one embodiment", "an example embodiment", "some embodiments", and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

The terms "over", "under", "between", and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting wafer without consideration of the absolute orientation of the wafer.

Figure 2A:
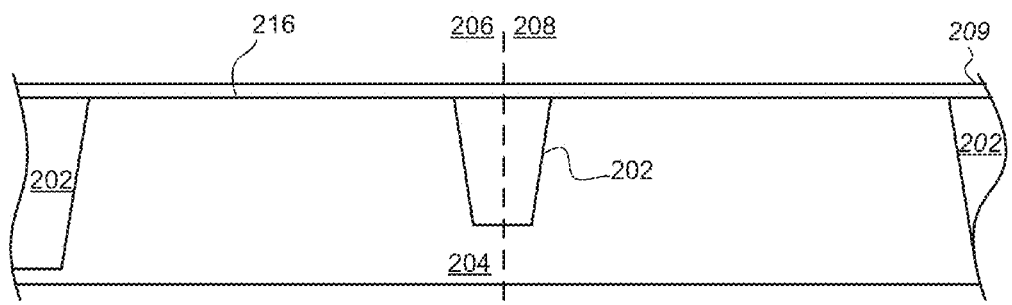
FIGS. 2A-2N are representative diagrams illustrating cross-sectional views of a portion of a memory cell during fabrication of the memory cell according to the method of FIG. 1.

The NVM transistor may include memory transistors or devices implemented related to Silicon-Oxide-Nitride-Oxide-Silicon (SONOS) or floating gate technology. An embodiment of a method for integrating or embedding a NVM transistor into a standard or baseline CMOS process flow for fabricating one or more MOS transistors will now be described in detail with reference to FIG. 1 and FIGS. 2A through 2N. FIG. 1 is a flowchart illustrating an embodiment of a method or process flow for fabricating the memory cell or array. FIGS. 2A-2N are block diagrams illustrating cross-sectional views of a portion of a memory cell during fabrication of the memory cell according to the method of FIG. 1. FIG. 2O is a representative diagram illustrating a cross-sectional view of a portion of an embodiment of the finished memory cell or array.

In some embodiments of application, such as smartcard applications, NVM transistors are embedded into MOS transistors including HV I/O or HV MOS transistors in which a thick gate oxide is required. For instance, in one embodiment, one of the MOS transistors is a high voltage I/O transistor and thus requires a thick gate oxide having an approximate thickness of up to 100 Å to 200 Å. In some process flows, HV MOS gate oxide and NVM blocking oxide are formed concurrently. While the HV MOS gate oxide may be formed/grown to its required thickness, since blocking or top oxide of the NVM transistor is subjected to the same environment during oxidation of the gate oxide of HV MOS transistor(s), it may be grown to be too thick. As a result, the NVM transistor may not meet the requirements for EOT and program/erase Vts.

In this disclosure, a process to embed an Oxide-Nitride-Oxide (ONO) or ONONO charge trapping stack with bi-layer nitride into a CMOS process that uses a thick gate oxide for its HV or HV I/O devices is introduced and described. In some embodiments, the aforementioned ONO stack formation sequence may not be appropriate for CMOS process flows that include fabrication of thick I/O gate oxide layers for some of the HV MOS transistors. In such a process flow, in-situ steam generation (ISSG) or radical oxidation process may not be ideal for the gate oxidation for both top oxide layer of the NVM transistors and gate oxide layer for the HV I/O MOS transistors. In order to achieve the targeted thickness of gate oxide of HV I/O MOS transistors, top oxide grown on the ONO stack may be exposed to the ISSG process for too long and end up being too thick. Alternatively, gate oxide of the HV I/O MOS transistors may be grown by either a furnace process or a rapid thermal oxidation (RTO) process. In those embodiments, the furnace process or RTO process may effect moisture from isolation structures, such as shallow trench isolation (STI) dielectric, to diffuse to the ONO film, and change the thickness or uniformity of thickness of the critical tunnel oxide layer of the NVM transistors. As a result, threshold voltage of the NVM transistors may be degraded. Moreover, furnace and RTO processes are operated at very high temperature (up to approximately 1100° C.). The high temperature may cause changes in trap density of the nitride layer of the ONO stack, which may also degrade the threshold voltage of the NVM transistors.

Embodiments depicted herein may be directed to fabrication processes that ensure that the ONO stack of the NVM transistors meets the thickness and reliability requirements without degradation of the ONO stack performance, due to the thick gate layer oxidation of the HV MOS transistors in an embedded system.

Referring to FIG. 1 and FIG. 2A, the process begins with forming a number of isolation structures or STI 202 in a substrate or wafer 204 (step 102). The isolation structures 202 isolate the memory cell being formed from memory cells formed in adjoining areas (not shown) of the wafer 204. Optionally and additionally, isolation structures 202 may be incorporated to isolate the NVM transistor being formed in a first region 206 of the wafer 204 from one or more of the MOS transistors being formed in a second region 208. In one embodiment, the isolation structures 202 may include a dielectric material, such as oxide or nitride, and may be formed by any conventional technique, including but not limited to shallow trench isolation (STI) or local oxidation of silicon (LOCOS). The wafer 204 may be a bulk wafer composed of any single crystal material suitable for semiconductor device fabrication, or may include a top epitaxial layer of a suitable material formed on a wafer. In one embodiment, suitable materials for the wafer 204 include, but are not limited to, silicon, germanium, silicon-germanium or a Group III-V compound semiconductor material.

Optionally and in some embodiments, as best shown in FIG. 2A, a pad oxide 209 may be formed over a surface 216 of the wafer 204 in both the first region 206 and the second region 208. In one embodiment, pad oxide 209 may be silicon dioxide ($SiO_2$) having a thickness of from about 10 nanometers (nm) to about 20 nm and may be grown by a thermal oxidation process or in-situ steam generation (ISSG) process, or other oxidation processes known in the art. It will be the understanding that pad oxide 209 may not be necessary, or formed in some embodiments.

Figure 2B:
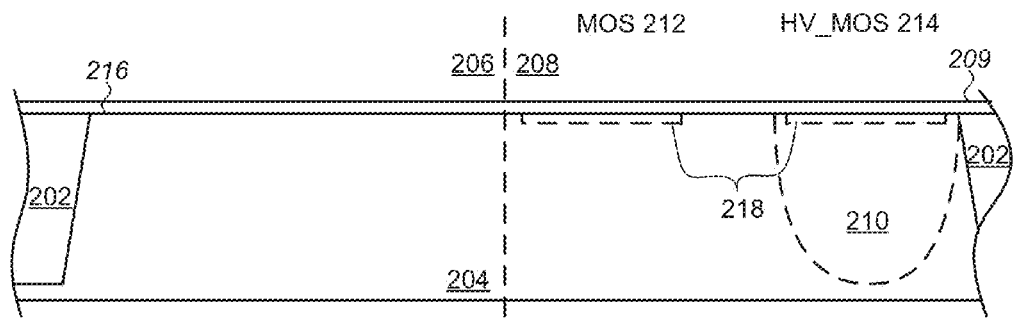
FIG. 2O is a representative diagram illustrating a cross-sectional view of a portion of a finished memory cell including an embedded SONOS based NVM transistor and MOS transistors fabricated according to the method of FIGS. 1 and 2A-2N.

Referring to FIG. 1 and FIG. 2B, dopants are then implanted into wafer 204 through pad oxide 209 to form wells in which the NVM transistor and/or the MOS transistors will be formed, and channels for the MOS transistors (step 104). According to system design, there may or may not be isolation structures 202 disposed between the first region 206 and the second region 208. The dopants implanted may be of any type and concentration, and may be implanted at any energy, including energies necessary to form wells or deep wells for the NVM transistor and/or the MOS transistors, and to form channels for the MOS transistors. In one particular embodiment, illustrated in FIG. 2B as an example, dopants of an appropriate ion species are implanted to form a deep N-well 210 in the second region 208 over or in which a high-voltage (HV) MOS transistor 214, such as an input/output (I/O) MOS transistor, will be formed. In alternative embodiments, wells or deep wells can also be formed for the NVM transistor 226 and/or a standard or low-voltage (LV) MOS transistor 212, such as an MOS transistor. It is further appreciated that the wells, such as deep N-well 210, may be formed by depositing and patterning a mask layer, such as a photoresist layer above surface 216 of wafer 204, and implanting an appropriate ion species at an appropriate energy to an appropriate concentration.

In one embodiment, channels 218 for one or more of the MOS transistors 214, 212, are formed in the second region 208 of wafer 204. As with the well implant, channels 218 are formed by depositing and patterning a mask layer, such as a photoresist layer above the surface 216 of wafer 204, and implanting an appropriate ion species at an appropriate energy to an appropriate concentration. In one embodiment, for example, $BF_2$ may be implanted at an energy of from about 10 kilo-electron volts (keV), to about 100 keV, and a dose of from about 1e12 $cm^{-2}$ to about 1e14 $cm^{-2}$ to form an N-type MOS (NMOS) transistor. A P-type MOS (PMOS) transistor may likewise be formed by implantation of arsenic (As) or phosphorous (P) ions at any suitable dose and energy. It is appreciated that implantation may also be used to form channels 218, in both of the MOS transistors 214, 212, at the same time, or at separate times using standard lithographic techniques, including a patterned photoresist layer to mask one of the channels for the MOS transistors 214, 212.

Figure 2C:
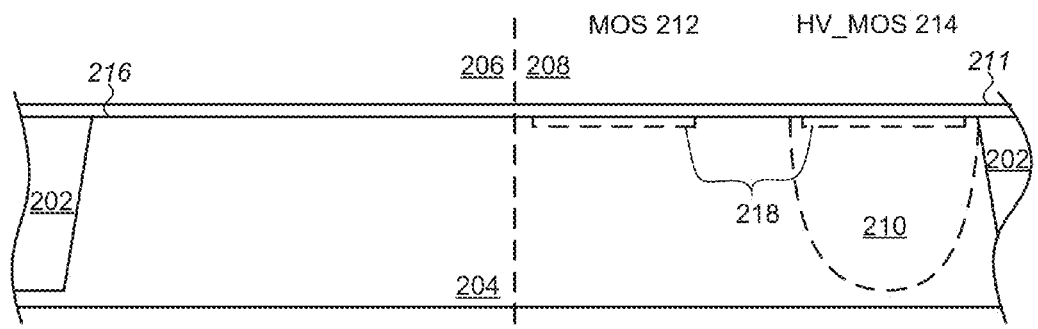

Next, referring to FIG. 1 and FIG. 2C, gate oxide 211 layer is formed over wafer 204 (step 106), either directly or indirectly. In one embodiment, as best illustrated in FIG. 2C, the process starts when pad oxide 209 is completely removed in a pad oxide preclean process. The pad oxide preclean may involve, for example a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry. After pad oxide 209 is removed, gate oxide 211 layer is formed by a rapid thermal dry oxidation (RTO) process, a conventional or furnace oxidation process, a rapid and radical wet oxidation process such as in-situ steam generation (ISSG), a chemical vapor deposition process (CVD), or other oxide forming processes known in the art, or a combination thereof.

In one embodiment, as an example, the oxidation process starts with dry RTO performed in a batch or single wafer processing chamber with or without an ignition event such as plasma. For example, the device is subjected to a rapid thermal oxidation process involving flowing oxygen ($O_2$) gas into a processing chamber. The $O_2$ gas is permitted to react at a temperature approximately in the range of 1000-1100° C. at a pressure approximately in the range of 0.5-5 Torr. to form gate oxide 211 layer. In one embodiment, gate oxide 211 layer is grown, by oxidizing silicon wafer 204, on at least a portion of the surface 216 of wafer 204. In one alternative embodiment, RTO process may be substituted with a rapid molecular oxidation (dry or wet) which is a non-radical oxidation process. In another embodiment, gate oxide 211 is formed by a wet rapid and radical oxidation process, such as in-situ steam generation (ISSG). The wet rapid and radical oxidation may be performed in a batch or single wafer processing chamber with or without an ignition event such as plasma. For example, in one embodiment, gate oxide 211 layer may be grown in a wet radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of 1000-1100° C. at a pressure approximately in the range of 0.5-10 Torr. to form radicals, such as, an OH radical, an $HO_2$ radical or an O diradical radicals. The oxidation process is carried out for a duration approximately in the range of 1-5 minutes for a single wafer using an ISSG process, or 30-120 minutes for a batch furnace process to effect growth of gate oxide 211 layer. During the period, gate oxide 211 layer is grown in both the first and second regions 206 and 208. In alternative embodiments, wet rapid and radical oxidation may be substituted by processes such as chemical vapor deposition (CVD), or other radical oxidation processes performed in a batch or single wafer processing chamber with or without an ignition event such as plasma as long as oxide will be grown or deposited to form gate oxide 211 layer of MOS transistor(s). In one embodiment, by controlling operation parameters in the gate oxide 211 layer formation, targeted thickness of gate oxide 211 layer may be achieved. The parameters may include time duration, temperature, pressure, reactants etc. of the RTO, ISSG, furnace oxidation, and CVD processes. As will be explained in later sections, at least a portion of gate oxide 211 layer remains in the finished device as gate oxide 211 of HV or HV I/O MOS transistor 214. In one embodiment, to withstand the relatively high operating voltage, desirable thickness of gate oxide 211 layer may be targeted to be approximately between 100 Å to 200 Å, or other thicknesses. It will be understood that such a range is merely illustrative and is not meant to be limiting. In one embodiment, gate oxide 211 layer may be formed, in the processes described in FIG. 2C, to be thicker than the desirable thickness. Excessive gate oxide 211 layer may be removed in later processes, as best illustrated in FIG. 2I, to achieve the desirable or final thickness of gate oxide 211 of HV I/O MOS transistor 214.

Figure 2D:
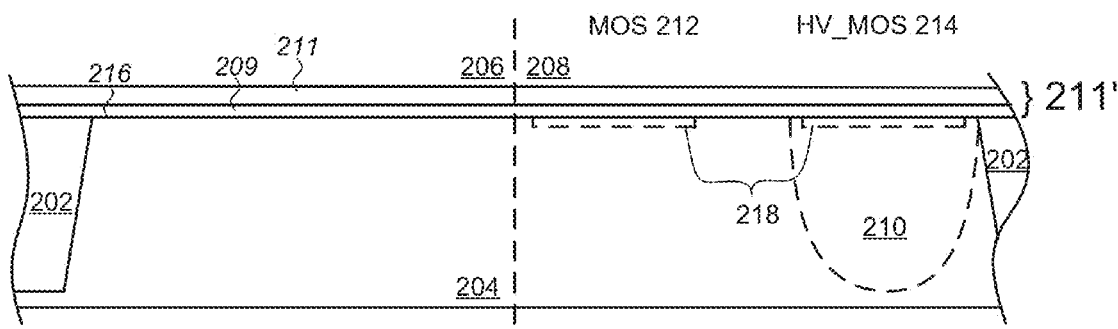

Referring to FIG. 1 and FIG. 2D, gate oxide 211' layer is formed over wafer 204 (step 106) in an alternative embodiment. As best illustrated in FIG. 2D. pad oxide 209 is not completely removed during the pad oxide preclean process, as previously described. In one embodiment, the pad oxide preclean process may be entirely omitted. As a result. STI oxide recession in corners of STI trenches, which may happen in the pad oxide preclean process, may be reduced, which may in turn minimize charge leakage. In another embodiment, the pad oxide preclean process is carried out but does not remove the entirety of pad oxide 209. Gate oxide 211 layer is then formed in the aforementioned processes at least over the remaining or bottom layer of pad oxide 209. In both embodiments, remaining pad oxide 209 becomes a part of the finished gate oxide 211' layer. In one embodiment, operation parameters of the pad oxide preclean process and the gate oxide formation process may be configured to achieve the combined thickness of gate oxide 211' layer. As previously discussed, the combined thickness of gate oxide 211' layer may be greater than the desirable or final gate thickness, and excessive gate oxide 211' layer may be removed in later processes. In one embodiment, since pad oxide 209 and gate oxide 211 layer are formed separately and individually, they may be different chemically, in stoichiometric composition and ratio, and/or physically. Moreover, there may be an interface (not shown) between pad oxide 209 and gate oxide 211 layer in the combined structure.

Figure 2E:
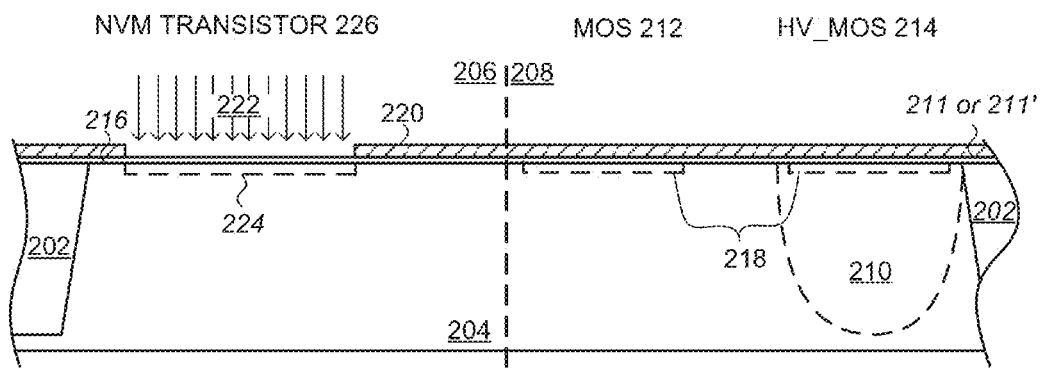
Figure 2F:
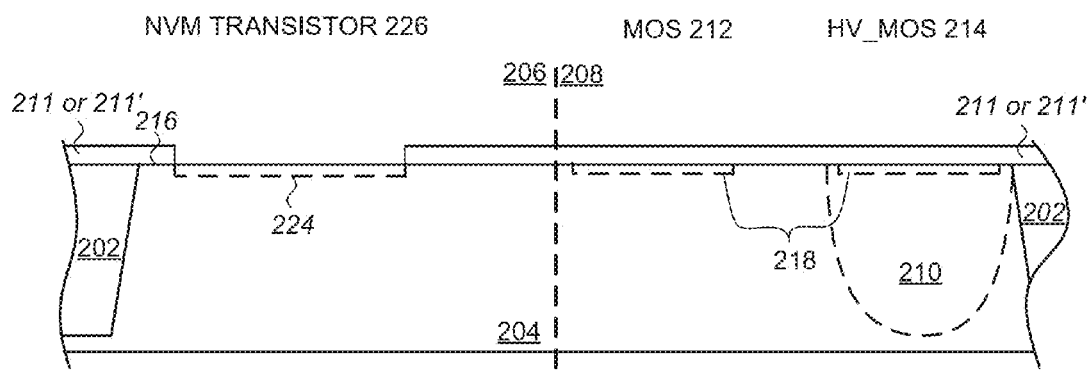

Next, referring to FIG. 1 and FIGS. 2E and 2F, a patterned tunnel mask 220 is formed on or overlying gate oxide 211 or 211' layer, ions (represented by arrows 222) of an appropriate, energy and concentration are implanted through a window or opening in tunnel mask 220 to form a channel 224 for NVM transistor 226 in first region 206, and tunnel mask 220 and gate oxide 211 or 211' layer in at least the second region 208 removed (step 108). Tunnel mask 220 may include a photoresist layer, or a hard mask formed, from a patterned nitride or silicon-nitride layer.

In one embodiment, channel 224 for NVM transistor 226 may be a deep indium doped channel implanted with indium (In) at an energy of from about 50 kilo-electron volts (keV) to about 500 keV, and a dose of from about 5e11 $cm^{-2}$ to about 1e13 $cm^{-2}$ to form an n-channel NVM transistor 226. In one embodiment, implanting indium to form channel 224 of NVM transistor 226 improves the threshold voltage ($V_T$) uniformity of the finished NVM transistor from a sigma of $V_T$ from about 150 millivolts (mV) to about 70-80 mV. Optionally or additionally, a shallow doped channel is implanted with arsenic at an energy about 20 keV and a dose of from about 5e11 $cm^{-2}$ to about 1e13 $cm^{-2}$ at channel 224. Alternatively, $BF_2$ may be implanted to form an n-channel NVM transistor, or arsenic or phosphorous implanted to form a p-channel NVM transistor. In one alternative embodiment, channel for NVM transistor 226 may also be formed concurrently with channels 218 of the MOS transistors 214, 212.

In one embodiment, as illustrated in FIG. 2F, gate oxide 211 or 211' in the window or opening in the tunnel mask 220 may be removed, for example in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry. Subsequently or concurrently, tunnel mask 220 includes photoresist material may be ashed or stripped using oxygen plasma. Alternatively, hard tunnel mask 220 may be removed using a wet or dry etch process.

Referring to FIG. 1 and FIGS. 2G to 2I, the surface 216 of wafer 204 is cleaned or precleaned, a number of dielectric layers, such as oxide-nitride-oxide or ONO layers or oxide-nitride-oxide-nitride-oxide or ONONO layers, formed or deposited, a mask formed on or overlying the dielectric layers, and the dielectric layers etched to form a dielectric gate stack 236 in first region 206 (step 110). The preclean may be a wet or dry process. In one embodiment, it may be a wet process using HF or standard cleans (SC1) and (SC2), and is highly selective to the material of wafer 204. In one embodiment, SC1 is typically performed using a 1:1:5 solution of ammonium hydroxide ($NH_4OH$), hydrogen peroxide ($H_2O_2$) and water ($H_2O$) at 30° C. to 80° C. for about 10 minutes. In another embodiment, SC2 is a short immersion in a 1:1:10 solution of HCl, $H_2O_2$ and $H_2O$ at about 30° C. to 80° C.

Figure 2G:
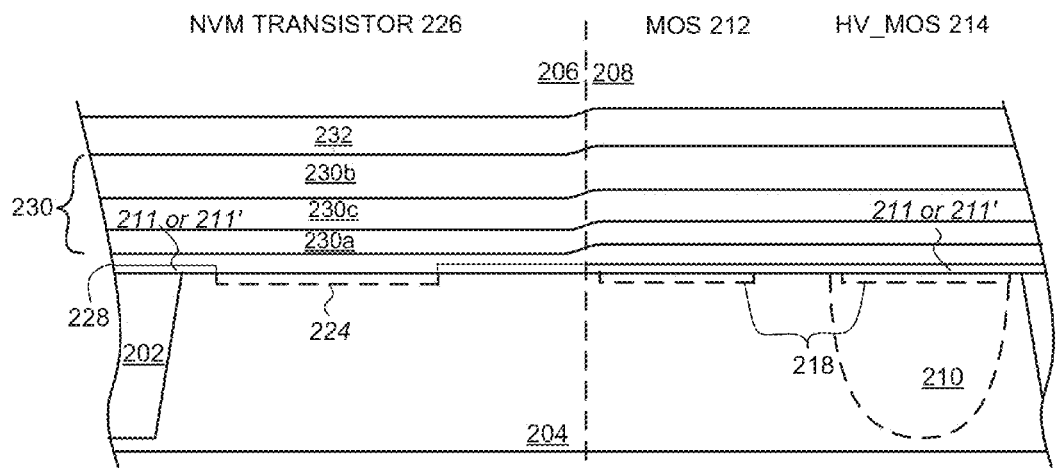

Referring to FIG. 2G, the dielectric or ONO or ONONO deposition begins with the formation of a tunnel dielectric 228 over at least the channel 224 of NVM transistor 226 in the first region 206 of wafer 204, and may spread over gate oxide 211 or 211' in second region 208 of wafer 204 where MOS transistors 212 and/or 214 are formed. The tunnel dielectric 228 may be any material and have any thickness suitable to allow charge carriers to tunnel into an overlying charge-trapping layer under an applied gate bias while maintaining a suitable barrier to leakage when NVM transistor 226 is unbiased. In certain embodiments, tunnel dielectric 228 is silicon dioxide, silicon oxy-nitride, or a combination thereof and can be grown by a thermal oxidation process, using ISSG or radical oxidation.

In one embodiment a silicon dioxide tunnel dielectric 228 may be thermally grown in a thermal oxidation process. For example, a layer of silicon dioxide may be grown utilizing dry oxidation at 750° C.-800° C. in an oxygen containing gas or atmosphere, such as oxygen ($O_2$) gas. The thermal oxidation process is carried out for a duration approximately in the range of 50 to 150 minutes to effect growth of a tunnel dielectric 228 having a relatively uniform thickness of from about 1.0 nanometers (nm) to about 3.0 nm by oxidation and consumption of the exposed surface of wafer. It will be understood that such a range is merely illustrative and is not meant to be limiting.

In another embodiment, a silicon dioxide tunnel dielectric 228 may be grown in a radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of about 900° C. to about 1100° C. at a pressure approximately in the range of about 0.5 Torr to about 10 Torr to form radicals, such as, an OH radical, an $HO_2$ radical or an O diradical, at the surface of wafer. The radical oxidation process is carried out for a duration approximately in the approximate range of about 1 to about 10 minutes to effect growth of a tunnel dielectric 228 having a thickness of from about 1.0 nanometers (nm) to about 4.0 nm by oxidation and consumption of the exposed surface of wafer. It will be understood that in FIG. 2G and subsequent figures the thickness of tunnel dielectric 228 may be exaggerated relative to gate oxide 211 or 211' layer, which is approximately 7 times thicker, for the purposes of clarity. In one embodiment, tunnel dielectric 228 grown in a radical oxidation process may be both denser and composed of substantially fewer hydrogen atoms per $cm^3$ than a tunnel dielectric formed by wet oxidation techniques, even at a reduced thickness. In certain embodiments, the radical oxidation process is carried out in a batch-processing chamber or furnace capable of processing multiple wafers to provide a high quality tunnel dielectric 228 without impacting the throughput (wafers/hr.) requirements that a fabrication facility may require.

In another embodiment, tunnel dielectric layer 228 is deposited by chemical vapor deposition (CVD) or atomic layer deposition and is composed of a dielectric layer which may include, but is not limited to silicon dioxide, silicon oxy-nitride, silicon nitride, aluminum oxide, hafnium oxide, zirconium oxide, hafnium silicate, zirconium silicate, hafnium oxy-nitride, hafnium zirconium oxide and lanthanum oxide. In yet another embodiment, tunnel dielectric 228 may be a bi-layer dielectric region including a bottom layer of a material such as, but not limited to, silicon dioxide or silicon oxy-nitride and a top layer of a material which may include, but is not limited to silicon nitride, aluminum oxide, hafnium oxide, zirconium oxide, hafnium silicate, zirconium silicate, hafnium oxy-nitride, hafnium zirconium oxide and lanthanum oxide.

Referring again to FIG. 2G, a charge-trapping layer is formed on or overlying the tunnel dielectric 228. Generally, as in the embodiment shown, the charge-trapping layer may be a multi-layer charge-trapping layer 230 comprising multiple layers including at least a lower or first charge-trapping layer 230 *a* which is physically closer to the tunnel dielectric 228, and an upper or second charge-trapping layer 230 *b* that is oxygen-lean relative to the first charge-trapping layer, and comprises a majority of a charge traps distributed in multi-layer charge-trapping layer 230.

The first charge-trapping layer 230 a of a multi-layer charge-trapping layer 230 may include a silicon nitride ($Si_3N_4$), silicon-rich silicon nitride or a silicon oxy-nitride ($SiO_xN_y$ (HO)) layer. For example, the first charge-trapping layer 230 a may include a silicon oxynitride layer having a thickness of between about 2.0 nm and about 6.0 nm formed by a CVD process using dichlorosilane (DCS)/ammonia ($NH_3$) and nitrous oxide ($N_2O$)/$NH_3$ gas mixtures in ratios and at flow rates tailored to provide a silicon-rich and oxygen-rich oxynitride layer.

The second charge-trapping layer 230 b of the multi-layer charge-trapping layer 230 is then formed, either directly or indirectly, over the first charge-trapping layer 230 a. In one embodiment, the second charge-trapping layer 230 b may include a silicon nitride and silicon oxy-nitride layer having a stoichiometric ratio of oxygen, nitrogen and/or silicon that is different from that of the first charge-trapping layer 230 a. The second charge-trapping layer 230 b may include a silicon oxynitride layer having a thickness of between about 2.0 nm and about 8.0 nm, and may be formed or deposited by a CVD process using a process gas including DCS/$NH_3$ and $N_2O$/$NH_3$ gas mixtures in ratios and at flow rates tailored to provide a silicon-rich, oxygen-lean top nitride layer. In one alternative embodiment, the stoichiometric composition of oxygen, nitrogen and/or silicon of first and second charge-trapping layers 230 a and 230 b may be identical or approximate to one another.

In another embodiment, there may be a dielectric and/or oxide layer 230 c formed between the first and second charge-trapping layers 230 a and 230 b, making the multi-layer charge trapping layer 230 an NON stack. In some embodiments, the multi-layer charge-trapping layer 230 is a split charge-trapping layer, further including a thin, middle oxide layer 230 c separating the first (lower) and second (upper) charge-trapping layers 230a and 230b. The middle oxide layer 230 c substantially reduces the probability of electron charge that accumulates at the boundaries of the second charge-trapping layer 230b during programming from tunneling into the first charge-trapping layer 230a, resulting in lower leakage current than for the conventional memory devices. In one embodiment, the middle oxide layer 230 c may be formed by oxidizing to a chosen depth of the first charge-trapping layer 230 a using thermal or radical oxidation. Radical oxidation may be performed, for example, at a temperature of 1000-1100° C. using a single wafer tool, or 800-900° C. using a batch reactor tool. A mixture of $H_2$ and $O_2$ gasses may be introduced to a process chamber at a ratio of approximately 1:1 and 10-15 Torr. using a single wafer tool, or a pressure of 300-500 Torr. for a batch process, for a time of 1-2 minutes using a single wafer tool, or 30 min to 1 hour using a batch process. In some embodiments, the radical oxidation process is without an ignition event, such as forming of plasma, which would otherwise typically be used to pyrolyze the $H_2$ and $O_2$ to form steam. Instead, the $H_2$ and $O_2$ is permitted to react at a surface of the first charge-trapping layer 230 a to form radicals, such as, an OH radical, an $HO_2$ radical or an O diradical, to form the middle oxide layer 230 c.

As used herein, the terms "oxygen-rich" and "silicon-rich" are relative to a stoichiometric silicon nitride, or "nitride," commonly employed in the art having a composition of ($Si_3N_4$) and with a refractive index (RI) of approximately 2.0. Thus, "oxygen-rich" silicon oxynitride entails a shift from stoichiometric silicon nitride toward a higher weight % of silicon and oxygen (i.e. reduction of nitrogen). An oxygen rich silicon oxynitride film is therefore more like silicon dioxide and the RI is reduced toward the 1.45 RI of pure silicon dioxide. Similarly, films described herein as "silicon-rich" entail a shift from stoichiometric silicon nitride toward a higher weight % of silicon with less oxygen than an "oxygen-rich" film. A silicon-rich silicon oxynitride film is therefore more like silicon and the RI is increased toward the 3.5 RI of pure silicon.

Referring again to FIG. 2G, the number of dielectric layers further includes a blocking oxide layer 232 that is formed on or overlying the charge-trapping layer 230. In one embodiment, blocking oxide layer 232 includes a silicon dioxide layer, formed by a CVD process in a low pressure chemical vapor deposition (LPCVD) chamber. For example, blocking oxide layer 232 may be deposited by a CVD process using a process gas including gas mixtures of silane or dichlorosilane (DCS) and an oxygen containing gas, such as $O_2$ or $N_2O$, in ratios and at flow rates tailored to provide a silicon dioxide ($SiO_2$) layer. In another embodiment, the blocking oxide layer 232 may include a silicon dioxide layer grown by a thermal oxidation process, in-situ steam generation (ISSG), or radical oxidation. In one embodiment, the deposited blocking oxide layer 232 may be protected and be the blocking oxide 232 in the final NVM gate stack 236, the reliability of the NVM stack may however be negatively impacted by the inferior quality blocking oxide 232.

Figure 2H:
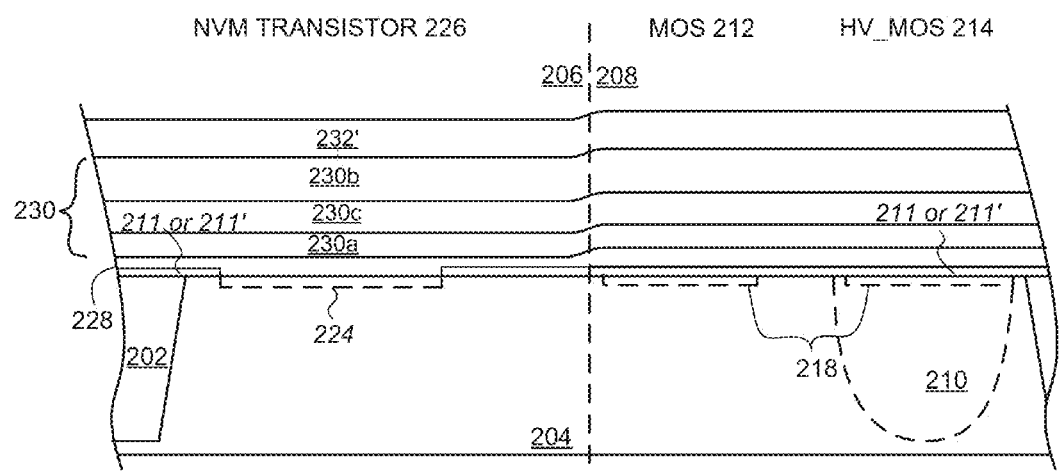
Figure 2I:
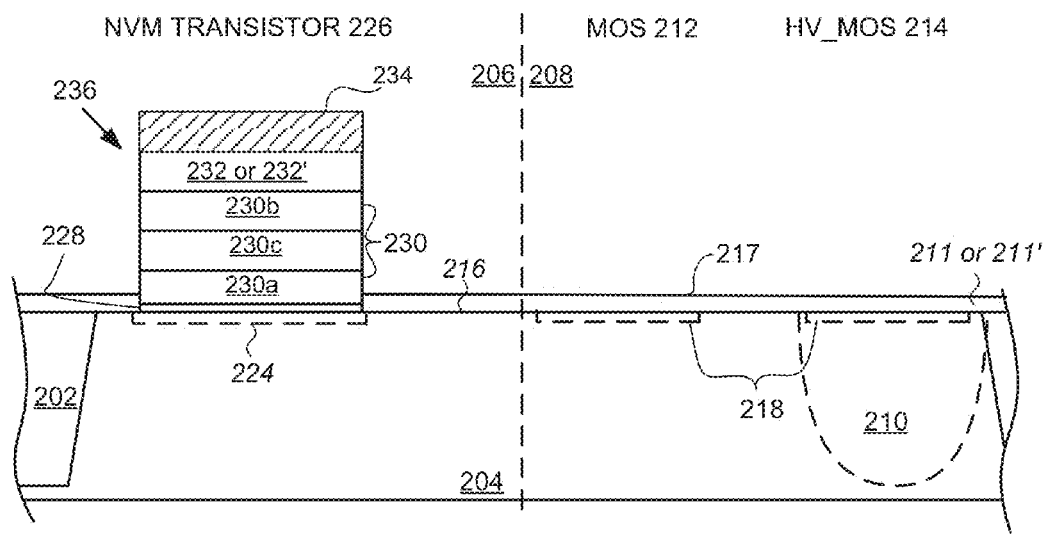

Referring to FIG. 2H, blocking oxide layer 232' is formed in an alternative embodiment. In one embodiment, blocking oxide layer 232' is grown using ISSG. At least a portion of second charge-trapping layer 230 b is oxidized and consumed during the ISSG to form blocking oxide layer 232'. The process starts when a sacrificial oxide layer (not shown) is formed on or overlying second charge-trapping layer 230 b. In one embodiment, the sacrificial oxide layer may be formed or deposited by a chemical vapor deposition process in a low pressure chemical vapor deposition (LPCVD) chamber. For example, the sacrificial oxide layer may be deposited by a CVD process using a process gas including gas mixtures of silane or dichlorosilane (DCS) and an oxygen containing gas, such as $O_2$ or $N_2O$, in ratios and at flow rates tailored to provide a silicon dioxide ($SiO_2$) sacrificial oxide layer. In another embodiment, the sacrificial oxide layer may include a silicon dioxide layer grown by a thermal oxidation process, in-situ steam generation (ISSG), or radical oxidation, and having a thickness of approximately between 2.0 nm and 4.0 nm. It will be understood that such a range is merely illustrative and is not meant to be limiting. Subsequently, the sacrificial oxide layer is removed, as least partially, by a wet etch process. In one embodiment, the oxidation process may progress immediately to a separated step of a wet rapid and radical oxidation process such as ISSG. Referring to FIG. 2H, for example, wet rapid and radical oxidation may be performed in a batch or single wafer processing chamber with or without an ignition event such as plasma. For example, in one embodiment the blocking oxide layer 232' may be grown in a wet radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of 1000-1100° C. at a pressure approximately in the range of 0.5-10 Torr. to form radicals, such as, an OH radical, an $HO_2$ radical or an O diradical radicals at a surface of second charge-trapping layer 230 b. The oxidation process is carried out for a duration approximately in the range of 1-5 minutes for a single wafer using an ISSG process, or 30-120 minutes for a batch furnace process to effect growth of blocking oxide layer 232' by oxidation and consumption of second charge-trapping layer 230 b in both first and second regions 206 and 208. In one embodiment, after the wet radical oxidation process such as ISSG, blocking oxide layer 232' may have a thickness of from about 30 Å to about 45 Å. It will be understood that such a range is merely illustrative and is not meant to be limiting. In alternative embodiments, the step of wet rapid and radical oxidation may be substituted by processes such as chemical vapor deposition (CVD), or other radical oxidation processes performed in a batch or single wafer processing chamber with or without an ignition event such as plasma as long as oxide will be grown or deposited both on second charge-trapping layer 230 b. One of the benefits of growing blocking oxide layer 232', using an oxidation process such as ISSG, is that the grown blocking oxide layer 232' may have a more uniform structure and better quality oxide compared to blocking oxide layer 232, which may be formed by deposition methods.

In another alternative embodiment, no sacrificial oxide layer is deposited over second charge-trapping layer 230 b. Blocking oxide layer 232" (not shown) is formed by oxidizing and consuming a portion of second charge-trapping layer 230 b using radical oxidation and other processes, such as ISSG, as previously described.

It will be the understanding that, regardless of the formation method, blocking oxide layer 232 or 232' is formed separately from and subsequent to the formation of gate oxide 211 or 211' layer, as depicted in FIGS. 2C and 2D.

Referring to FIG. 2I, a patterned mask layer 234 is formed on or overlying the blocking oxide layer 232 or 232' over channel 224 in first region 206. Subsequently, blocking oxide layer 232 or 232', charge-trapping layers 230, and tunnel dielectric layer 228 are etched or patterned to form gate stack 236 overlying channel 224 of the NVM transistor 226. Simultaneously or concurrently, blocking oxide layer 232 or 232', charge-trapping layers 230, and tunnel dielectric layer 228 in at least second region 208 of the wafer 204 may be removed. In one embodiment, the patterned mask layer 234 may include a photoresist layer patterned using standard lithographic techniques, and blocking oxide layer 232 or 232', charge-trapping layers 230, and tunnel dielectric layer 228 may be etched or removed using a dry etching process including one or more separate steps to stop at a top surface 217 of gate oxide 211 or 211' layer in first and second regions 206 and 208. In one embodiment, the dry etching process, such as plasma etching and reactive-ion etching (RIE), may etch out or remove a top portion of gate oxide 211 or 211' layer. In one embodiment, the desirable or final thickness of gate oxide 211 or 211' of HV I/O MOS transistor 214 in second region 208 may be controlled by the dry etching process. In one embodiment, the final or desirable thickness of gate oxide 211 or 211' of HV I/O MOS transistor 214 may be configured from about 100 Å to 200 Å, or other thicknesses, according to system requirements and design. It will be understood that such a range is merely illustrative and is not meant to be limiting. In one embodiment, after the oxidation process as previously described, the thickness ratio between blocking oxide 232 or 232' of NVM transistor and gate oxide 211 or 211' of at least one of the MOS transistors is in an approximate range of 1:2.22 (100 nm/45 nm) to 1:6.67 (200 nm/30 nm). It will be understood that such a range is merely illustrative and is not meant to be limiting.

In one embodiment, the separated steps of forming gate oxide 211 or 211' of HV I/O MOS transistors 214 and blocking oxide 232 or 232' of NVM transistors 226 may be carried out in single wafer tools. The dry thermal oxidation and wet radical oxidation processes can be either done in two different tools such as a rapid thermal anneal (RTA) single wafer tool for the dry RTO process and subsequently an ISSG single wafer tool for the ISSG process. Alternatively, dry and wet RTO may be carried out in one ISSG tool. In this particular embodiment, the oxidation is initially performed by raising the wafer temperature to 1000-1100° C. range and flowing $O_2$ only for a required amount of time to finish the dry RTO process. Subsequently, $H_2$ is introduced in order to start the ISSG oxidation. The operation temperature of the two oxidation steps is preferably kept at the same value.

In some embodiments, as explained briefly above, the dry radical RTO step and/or wet radical ISSG oxidation step may be carried out at a batch furnace. In these embodiments, the process flow is the same but in each oxidation, a batch of wafers (100-125 wafers) are subjected to the oxidation concurrently. This embodiment assumes that a capable batch type tool for radical oxidation is available. For this scheme to be successful, the gap fill dielectric, such as dielectric in isolation structures 202 and the ONO stack, needs to be of high quality with zero or minimum moisture content.

Figure 2J:
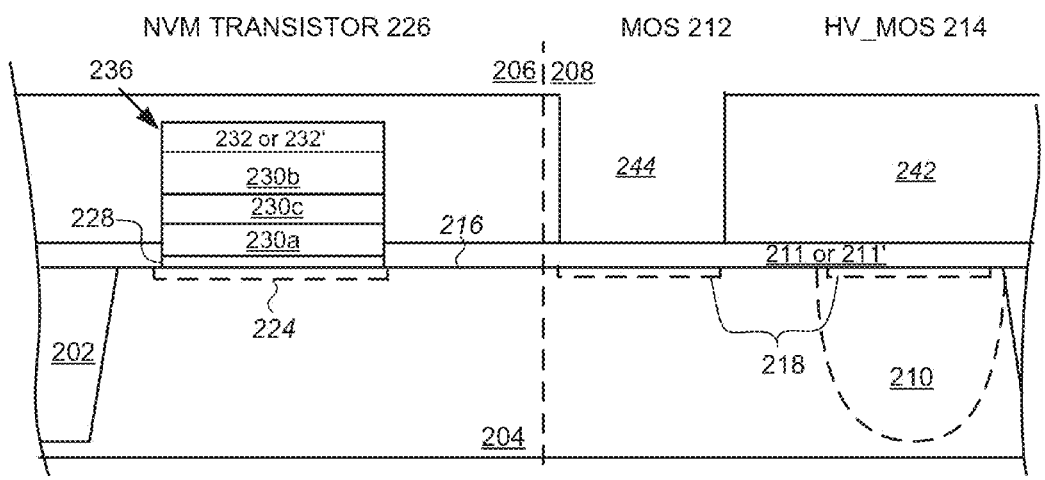
Figure 2K:
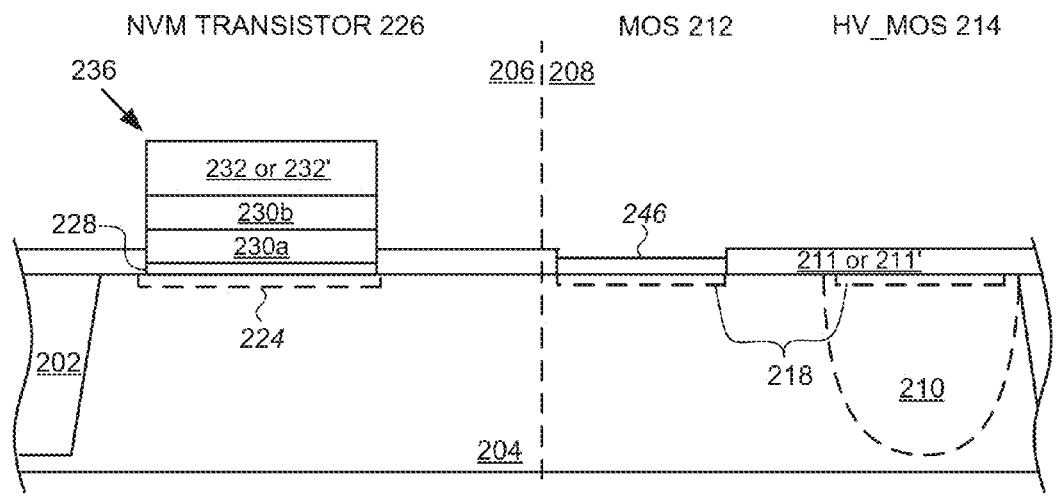
Figure 2L:
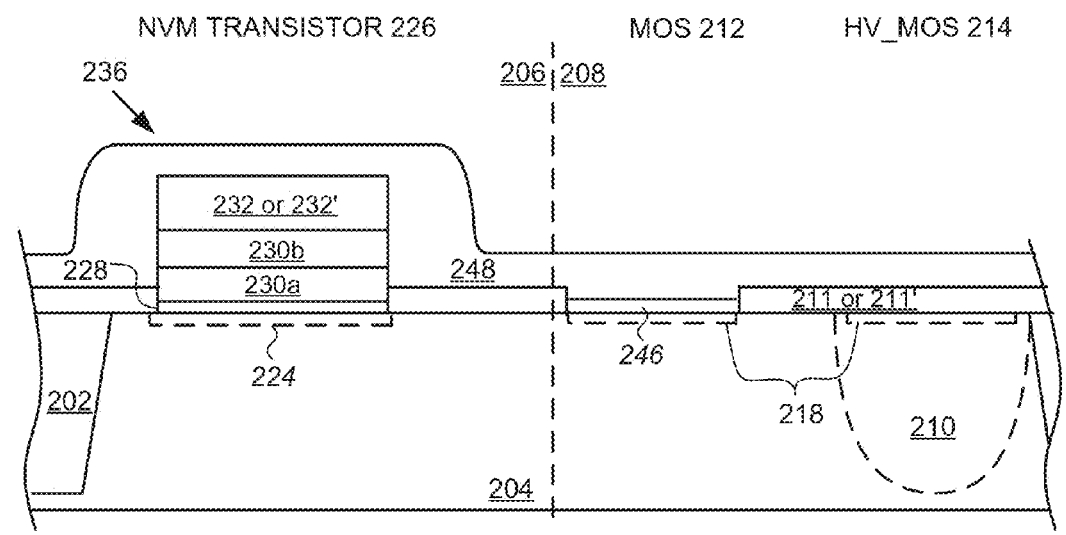
Figure 2M:
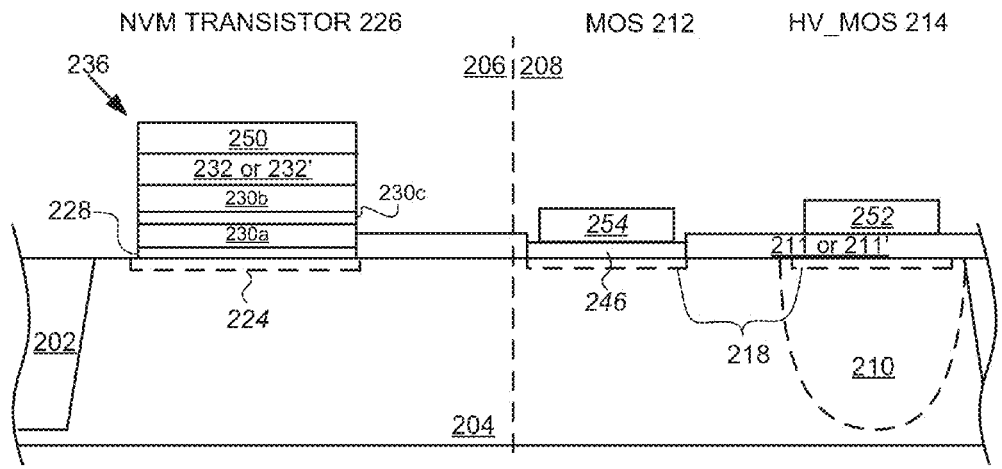
Figure 2N:
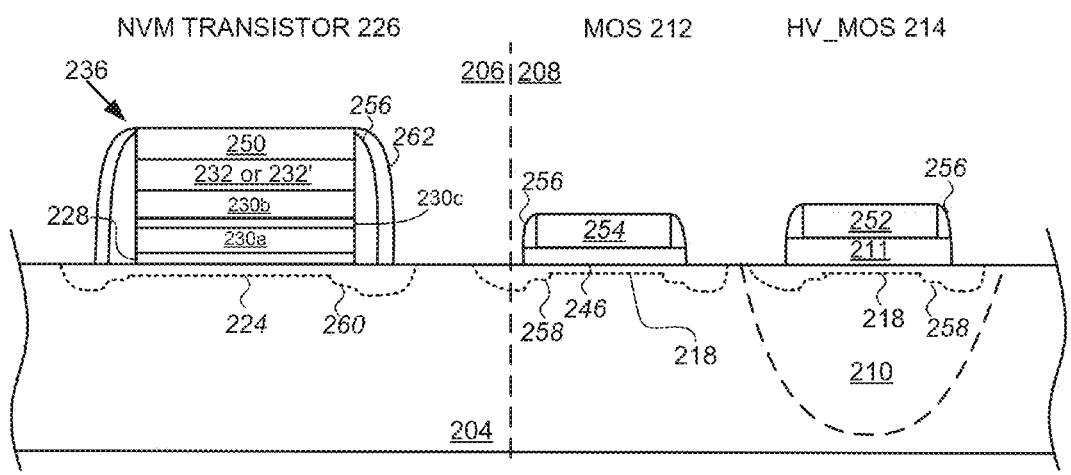
Figure 2O:
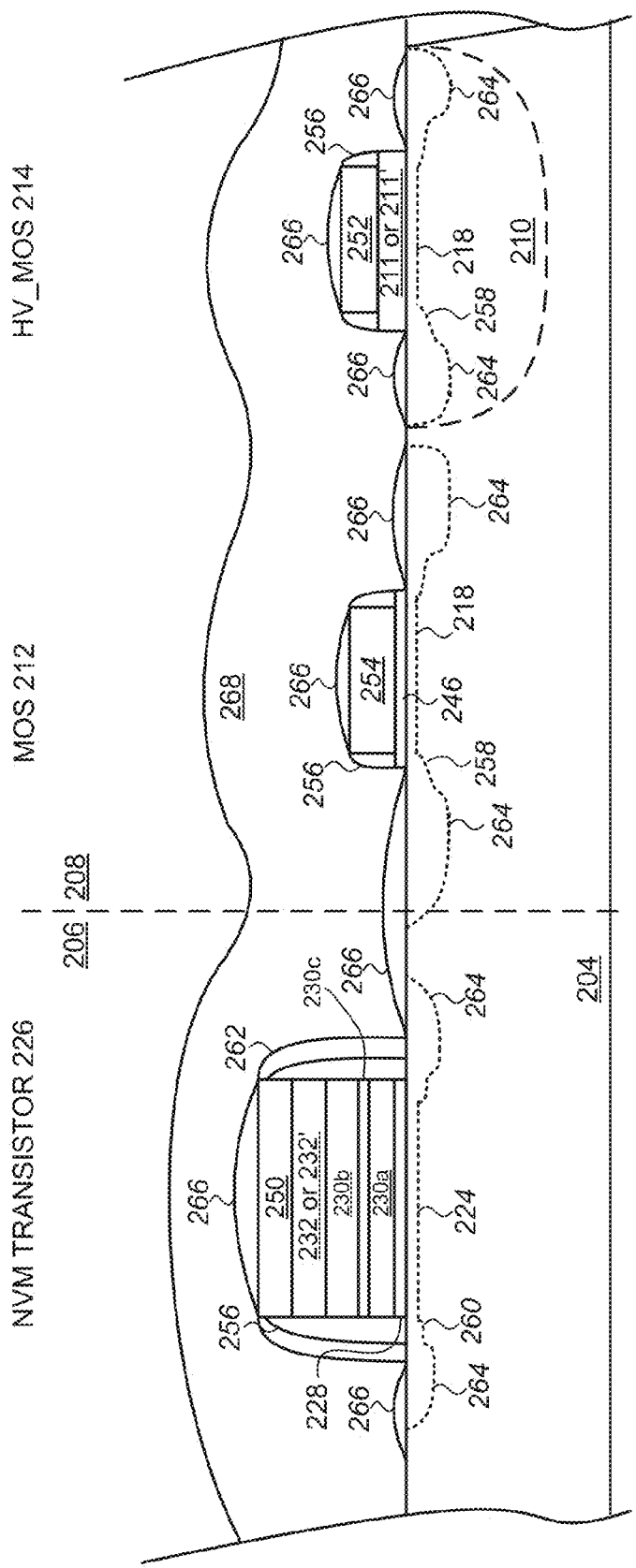

Referring to FIG. 1, in some embodiments, such as those shown in FIGS. 2J to 2N, the method further includes a dual gate oxide process flow to enable fabrication of both LV MOS transistors 212 and a HV MOS transistor, such as HV I/O MOS transistor 214. Referring to FIG. 2J, a patterned mask layer 242 is formed over the first and second regions 206, 208 of the wafer 204. The patterned mask layer 242 can be a photoresist layer patterned using standard lithographic techniques, and includes at least one opening 244 over a channel 218 in the second region 208. The thick gate oxide 211 or 211' layer is etched in the exposed regions by using a BOE etch, under conditions similar to those described above with respect to removing the sacrificial oxide layer, and the patterned mask layer 242 is then removed.

Referring to FIG. 2K, the wafer 204 is cleaned using a wet etch that does not etch oxide in order to protect thick gate oxide 211 or 211' of the HV MOS transistor 212, and the blocking oxide layer 232 or 232' of gate stack 236. The wafer 204 is then subjected to a thermal oxidation process to grow a thin, second gate oxide 246 of MOS transistor 212 having an appropriate thickness, such as from about 1 nm to about 3 nm, or other thicknesses. In some embodiments, the second gate oxide 246 can be overlaid with a deposited layer (not shown) such as silicon oxy-nitride, silicon nitride, aluminum oxide, hafnium oxide, zirconium oxide, hafnium silicate, zirconium silicate, hafnium oxy-nitride, hafnium zirconium oxide and lanthanum oxide.

Referring to FIG. 2L, a gate layer 248 of any conducting or semiconducting material suitable for accommodating a biasing of the NVM transistor 226 and operation of the MOS transistors 214, 212, is formed over the gate stack 236, the thick gate oxide 211 or 211' of HV MOS transistor 214, and the thin gate oxide 246 of LV MOS transistor 212. In one embodiment, the gate layer 248 is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt and nickel. In another embodiment, the gate layer is formed by a CVD process and is composed of a single doped polysilicon layer, which may then be patterned to form control gates of the NVM transistor 226 and MOS transistors 214, 212.

Referring to FIG. 2M, gate layer 248 is patterned using a mask layer (not shown) and standard lithographic techniques to stop on surfaces of blocking oxide layer 232 or 232', the thick gate oxide 211 or 211' and the thin gate oxide 246, thereby forming gate 250 for gate stack 236 of NVM transistor 226, gate 252 for HV MOS transistor 214, and gate 254 for MOS transistor 212.

Referring to FIG. 1 and FIG. 2N, a first spacer layer is deposited and etched to form first sidewall spacers 256 adjacent to the gates 252, 254, of the MOS transistors 212, 214, and the NVM transistor 226, and one or more lightly-doped drain extensions (LDD 258) are implanted adjacent to and extend under sidewall spacers 256 of one or more of the MOS transistors 212, 214 (step 116).

Next, a SONOS LDD mask is formed over the wafer 204 and lightly-doped drain extensions (LDD 260) are implanted, adjacent to the NVM transistor 226. Finally, a second spacer layer is deposited and etched to form second sidewall spacers 262 adjacent to the gate stack 236, of the NVM transistor 226 (step 118).

In one or more alternative embodiments, fabrication steps as illustrated and described in FIGS. 1 to 2N may be adapted or modified to manufacture a floating gate based NVM transistor, instead of or additional of the SONOS based NVM transistor 226 in an integrated baseline CMOS process.

Referring to FIGS. 1 and 2O, with the NVM transistor 226, HV MOS transistor 214 and LV MOS transistor 212 substantially complete, source and drain implants are performed to form source and drain regions 264 for all transistors and a silicide process performed (step 120). As depicted, silicide regions 266 may be formed on the exposed gates 250, 252 and 254 and exposed source and drain regions 264. The silicide process may be any commonly employed in the art, typically including a pre-clean etch, cobalt or nickel metal deposition, anneal and wet strip.

Referring FIG. 1 and FIG. 2O, optionally the method of fabricating memory cells including an embedded or integrally formed SONOS based NVM transistor and MOS transistor(s) further includes the step of forming a stress inducing layer or structure 268, such as a stress inducing nitride layer, over the gate stack 236 of the NVM transistor 226 to increase data retention and/or to improve programming time and efficiency (step 122). In particular, inducing stress into the charge-trapping layer 230 of the NVM transistor 226 changes energy levels of charge traps formed therein, thereby increasing charge retention of the charge-trapping layer. In addition, forming a stress inducing structure 268, in or on the surface 216 of the wafer 204 proximal to, and preferably surrounding, a region of the wafer in which the channel 224 of NVM transistor 226 is formed will reduce the band gap, and, depending on the type of strain, increases carrier mobility. For example, tensile strain, in which inter-atomic distances in the crystal lattice of the wafer 204 are stretched, increases the mobility of electrons, making N-type transistors faster. Compressive strain, in which those distances are shortened, produces a similar effect in P-type transistors by increasing the mobility of holes. Both of these strain induced factors, i.e., reduced band gap and increased carrier mobility, will result in faster and more efficient programming of NVM transistor 226.

The strain inducing structure 268 can include a pre-metal dielectric (PMD) layer formed using a High Aspect Ratio Process (HARP™) oxidation process, a compressive or tensile nitride layer formed using a plasma enhanced chemical vapor deposition (PECVD) or a Bis-Tertiary Butyl Amino Silane (BTBAS) nitride layer.

In certain embodiments, such as that shown in FIG. 2O, the stress inducing structure 268 may also be formed over one or more of the MOS transistors to induce strain in the channel of the MOS transistor.

Finally, the standard or baseline CMOS process flow is continued to substantially complete the front end device fabrication (step 124), yielding the structure shown in FIG. 2O. FIG. 2O is a block diagram illustrating a cross-sectional view of a portion of a finished memory cell including an embedded SONOS based NVM transistor and MOS transistors fabricated according to the method of FIGS. 1 and 2A-2N.

Figure 3:
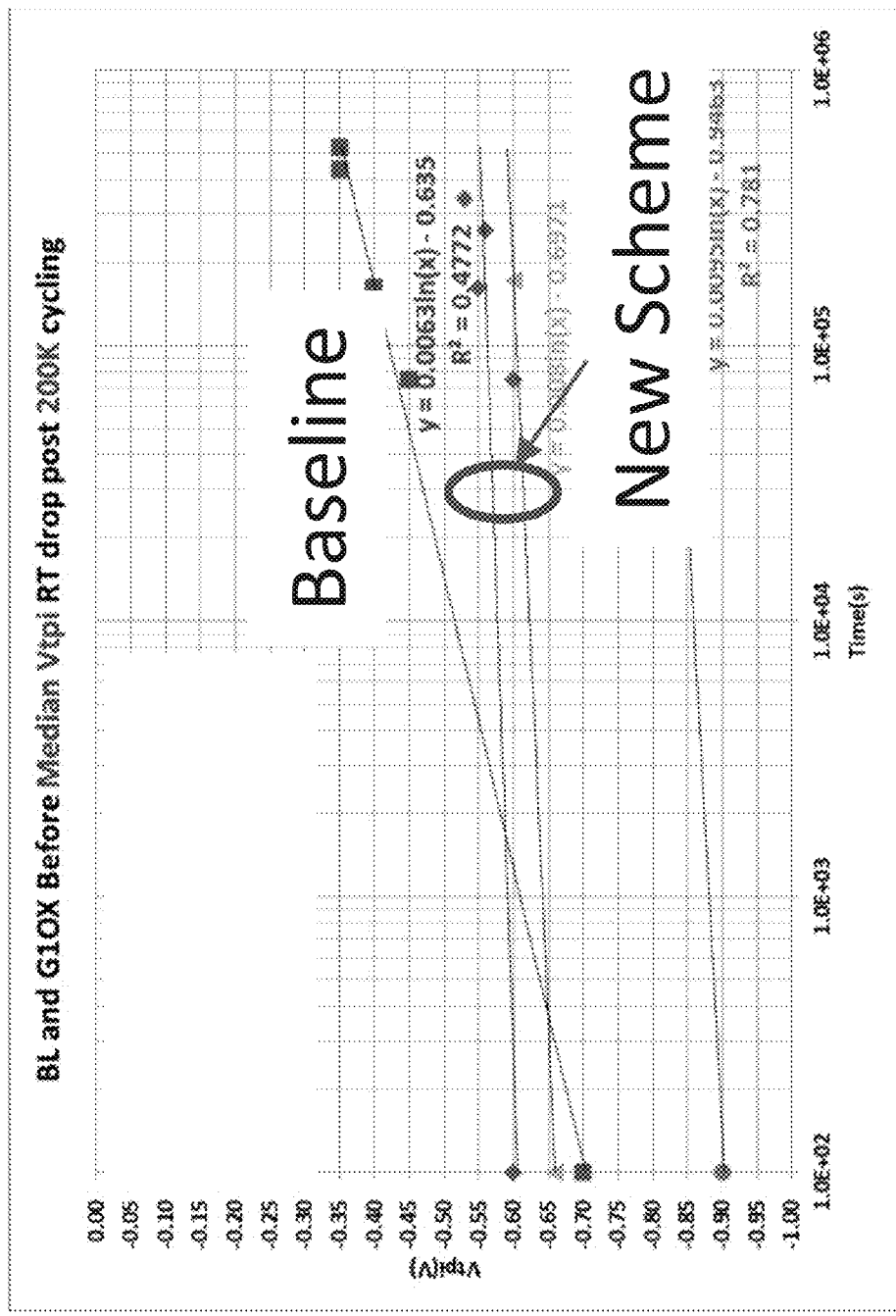
FIG. 3 is a representative diagram illustrating program state threshold voltage (Vtp) advantages of SONOS fabricated according to one embodiment of the method of FIG. 1.
Figure 4:
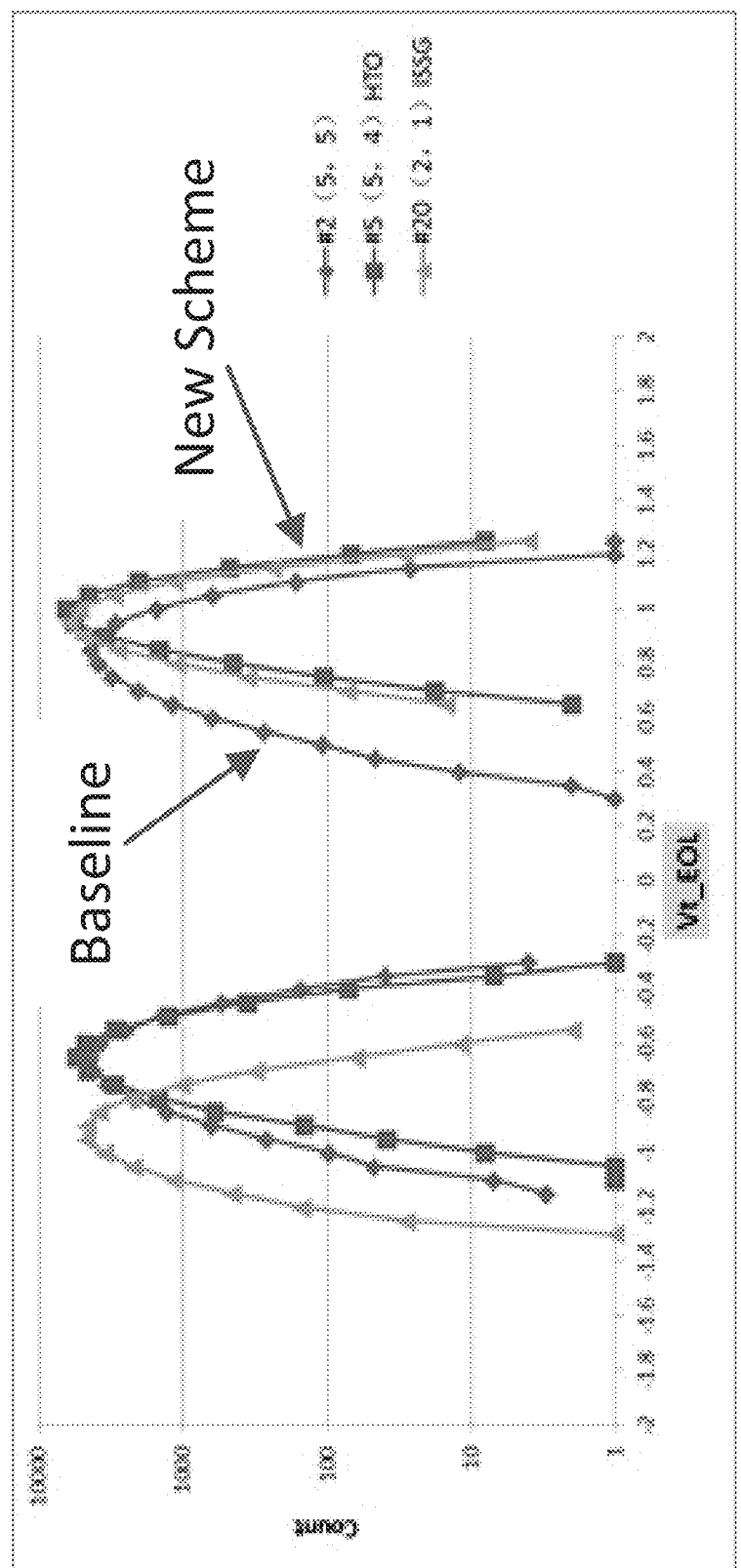
FIG. 4 is a representative diagram illustrating Vtp (End-of-Life) distribution of SONOS fabricated according to one embodiment of the method of FIG. 1.

FIGS. 3 and 4 are graphs illustrating improvements in threshold voltage ($V_T$) uniformity of an NVM transistor according to an embodiment of the present disclosure. Referring FIGS. 3 and 4, it is shown that the reliability performance of NVM transistors fabricated according to an embodiment of the present disclosure is much improved because the ONO layers are not impacted in any way by the thick gate oxide growth of the HV MOS transistors. The result remains consistent whether the thick gate oxide is formed by a furnace process or RTO process. Besides, dopants in the channel of NVM transistor may not see the thermal budget of the thick gate oxide formation process of the HV MOS transistors. Consequently, there is less possibility of dopant diffusion. There will also be less random dopant fluctuation and $V_T$ sigmas of the NVM transistor are much improved, as best illustrated in FIG. 4.

The Abstract of the Disclosure is provided to comply with 37 C.F.R. §1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

In the foregoing specification, the subject matter has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method, comprising:
   forming a first gate oxide layer over first and second regions of a substrate;

removing a first portion of the first gate oxide layer to create a first opening in the first region;
forming a dielectric stack over and in direct contact with the first gate oxide layer, wherein the dielectric stack includes tunneling dielectric, a charge-trapping layer, and a blocking oxide layer;
patterning the dielectric stack to form a non-volatile (NV) gate stack of a non-volatile memory (NVM) transistor in the first region while concurrently removing the dielectric stack in the second region; and
patterning the first gate oxide layer to form a first gate oxide of a high voltage (HV) transistor in the second region.

2. The method of claim 1, wherein forming the first gate oxide layer includes performing at least a conventional thermal oxidation process, a rapid thermal oxidation (RTO) process, an in-situ steam generation (ISSG) process, a rapid molecular oxidation, a chemical vapor deposition process, or a combination thereof.

3. The method of claim 1, further comprising:
forming a pad oxide, prior to forming the first gate oxide layer, on the substrate in the first and second regions;
removing at least a top layer of the pad oxide; and
forming the first gate oxide layer on a bottom layer of the pad oxide.

4. The method of claim 3, wherein the first gate oxide layer and the pad oxide include different chemical composition and stoichiometric ratio.

5. The method of claim 1, further comprising:
forming the first gate oxide layer to a first thickness; and
adjusting the first gate oxide layer to a second thickness during removing the dielectric stack in the second region, wherein the second thickness is a final thickness for the first gate oxide of the HV transistor.

6. The method of claim 5, wherein the second thickness is approximately between 100 angstrom and 200 angstrom.

7. The method of claim 6, wherein a ratio between a thickness of the blocking oxide of the NV gate stack and the second thickness of the HV transistor is in an approximate range of 1:6.67 to 1:2.22.

8. The method of claim 1, wherein the charge-trapping layer includes a multiple layer structure, further comprising:
forming a lower oxynitride layer of the multiple layer structure over the tunneling dielectric; and
forming an upper oxynitride layer of the multiple layer structure over the lower nitride layer,
wherein the upper and lower oxynitride layers include different stoichiometric ratios of silicon, nitrogen, and oxygen.

9. The method of claim 8, further comprising:
forming a middle oxide layer between the upper and lower oxynitride layers.

10. The method of claim 1, wherein forming the blocking oxide layer includes:
performing a chemical vapor deposition process to deposit the blocking oxide layer over the charge-trapping layer.

11. The method of claim 1, wherein forming the blocking oxide layer includes:
depositing a sacrificial oxide layer over the charge-trapping layer;
removing at least a portion of the sacrificial oxide layer; and
forming the blocking oxide layer by oxidizing and therefore consuming a top portion of the charge-trapping layer.

12. The method of claim 1, further comprising:
forming the NV gate stack at least partially inside the first opening.

13. The method of claim 1, further comprising:
removing a second portion of the first gate oxide layer to create a second opening in the second region; and
forming a second gate oxide of a low voltage (LV) transistor at least partially within the second opening over the substrate.

14. The method of claim 1, further comprising:
forming a pad oxide, prior to forming the gate oxide layer, over the substrate in the first and second regions; and
forming the first gate oxide layer over the pad oxide.

15. The method of claim 1, wherein patterning the dielectric stack includes:
performing a dry etching process including at least one of plasma etching or reactive-ion etching (RIE).

16. A method of integrating a silicon-oxide-nitride-oxide-silicon (SONOS) transistor into a complementary metal-oxide-silicon (CMOS) baseline process, comprising:
forming a gate oxide layer over a substrate;
forming a dielectric stack over the gate oxide layer;
patterning the dielectric stack to form a non-volatile (NV) gate stack of the SONOS transistor directly on the substrate including removing the dielectric stack beyond the NV gate stack and a top portion of the gate oxide layer; and
patterning the gate oxide layer to form a gate oxide of at least one metal-oxide-silicon (MOS) transistor.

17. The method of claim 16, further comprising:
removing a portion of the gate oxide layer to create an opening, wherein the NV gate stack of the SONOS transistor is formed at least partially within the opening.

18. The method of claim 16, wherein patterning the dielectric stack includes:
performing a dry etching process to remove the dielectric stack beyond the NV gate stack, wherein the dry etch process further remove the top portion of the gate oxide layer.

19. A method of integrating a silicon-oxide-nitride-oxide-silicon (SONOS) transistor in a complementary metal-oxide-semiconductor (CMOS) process flow, comprising:
forming a gate oxide layer over a first and a second regions of a substrate;
removing portions of the gate oxide layer in the first region to create a plurality of openings;
forming at least one SONOS transistor, each within one opening in the first region, wherein each SONOS transistor includes a blocking oxide; and
forming at least one MOS transistor in the second region, wherein the at least one MOS transistor includes a high voltage (HV) MOS transistor, wherein the HV MOS transistor includes a gate oxide formed by patterning the gate oxide layer, and wherein a thickness of the gate oxide of the HV MOS transistor is controlled by an etching process.

20. The method of claim 19, wherein the blocking oxide of the at least one SONOS transistor and the gate oxide layer are formed in two separate process steps, and wherein the thickness of the gate oxide of the HV MOS transistor is controlled by a dry etching process.

* * * * *